(12) United States Patent
Maccarrone et al.

(10) Patent No.: US 11,848,071 B2
(45) Date of Patent: *Dec. 19, 2023

(54) SYSTEMS AND METHODS INVOLVING WRITE TRAINING TO IMPROVE DATA VALID WINDOWS

(71) Applicant: Micron Technology, Inc., Boise, ID (US)

(72) Inventors: Agatino Massimo Maccarrone, Regalbuto (IT); Luigi Pilolli, L'Aquila (IT); Ali Feiz Zarrin Ghalam, Sunnyvale, CA (US); Chin Yu Chen, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/545,888

(22) Filed: Dec. 8, 2021

(65) Prior Publication Data

US 2022/0101898 A1 Mar. 31, 2022

Related U.S. Application Data

(63) Continuation of application No. 17/092,046, filed on Nov. 6, 2020, now Pat. No. 11,211,104, which is a continuation of application No. 16/447,727, filed on Jun. 20, 2019, now Pat. No. 10,861,517.

(51) Int. Cl.
*G11C 8/00* (2006.01)
*G11C 7/22* (2006.01)
*G11C 7/10* (2006.01)

(52) U.S. Cl.
CPC ............ *G11C 7/222* (2013.01); *G11C 7/1087* (2013.01); *G11C 7/1093* (2013.01); *G11C 2207/2254* (2013.01)

(58) Field of Classification Search
CPC ..... G11C 7/222; G11C 7/1087; G11C 7/1093; G11C 2207/2254
USPC ........................................ 365/233.1
See application file for complete search history.

(56) References Cited

U.S. PATENT DOCUMENTS

| | | | | |
|---|---|---|---|---|
| 6,016,282 A | * | 1/2000 | Keeth | G11C 7/22 365/233.13 |
| 6,366,115 B1 | * | 4/2002 | DiTommaso | H03K 5/1565 326/88 |
| 10,861,517 B1 | * | 12/2020 | Maccarrone | G11C 29/023 |
| 11,211,104 B2 | * | 12/2021 | Maccarrone | G11C 16/32 |
| 2015/0372701 A1 | | 12/2015 | Wang et al. | |
| 2020/0402554 A1 | | 12/2020 | Maccarrone et al. | |
| 2021/0057007 A1 | | 2/2021 | Maccarrone et al. | |

* cited by examiner

*Primary Examiner* — Vu A Le
(74) *Attorney, Agent, or Firm* — Greenberg Traurig

(57) ABSTRACT

Disclosed are systems and methods involving memory-side write training to improve data valid window. In one implementation, a method for performing memory-side write training may comprise delaying a rising edge or a falling edge of a first data signal, delaying a rising edge or a falling edge of a second data signal, and aligning the two adjusted signals to reduce a window of time that the data signals are not valid and thereby improve or optimize the data valid window (DVW) of a memory array. According to implementations herein, various edges of data signals and clock signals may be adjusted or delayed via dedicated trim cells or circuitry present in the data paths located on the memory side of a system.

20 Claims, 12 Drawing Sheets

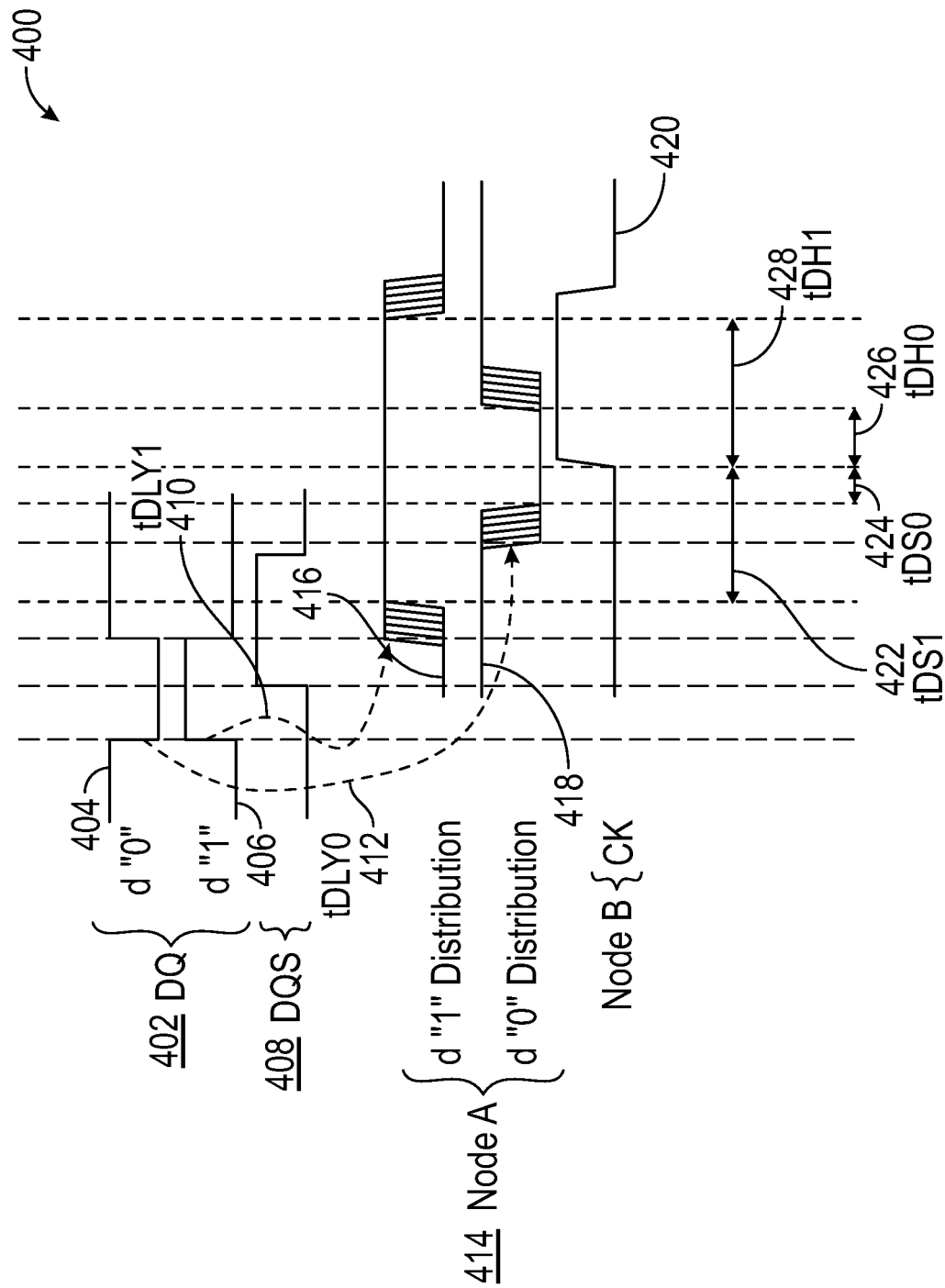

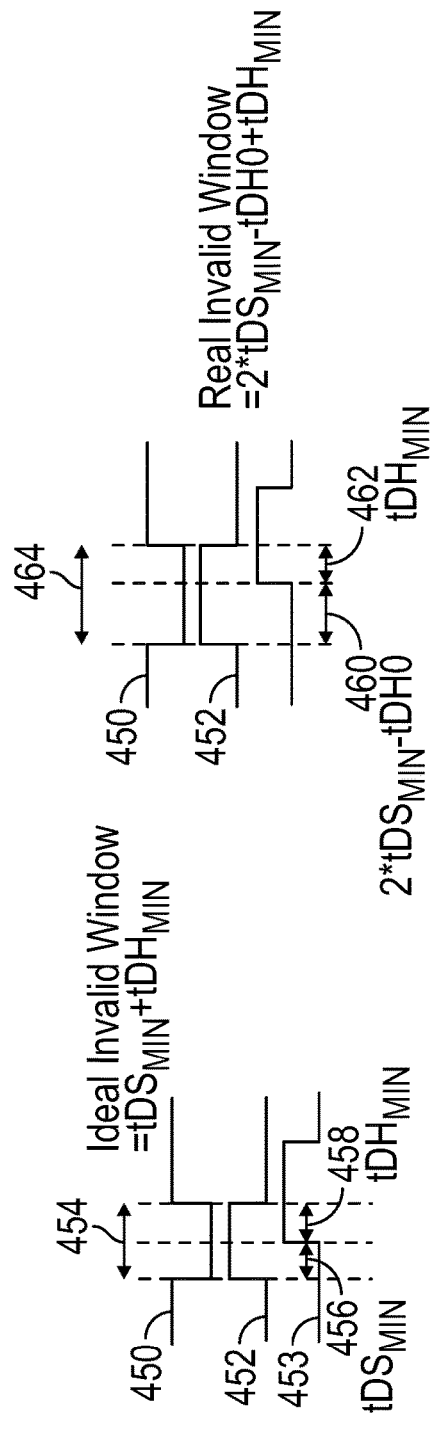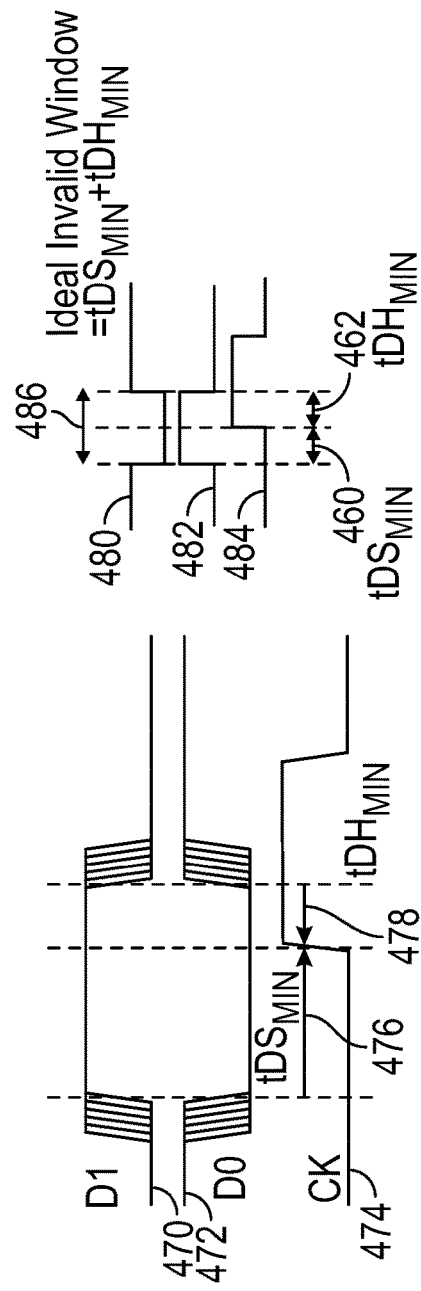

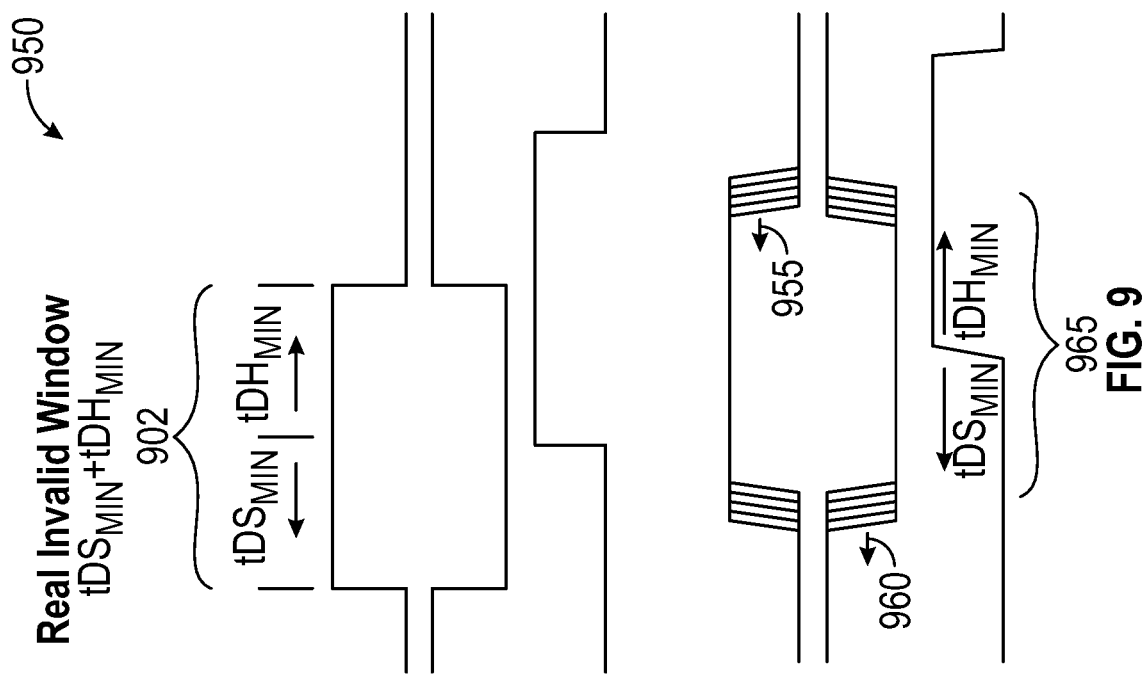
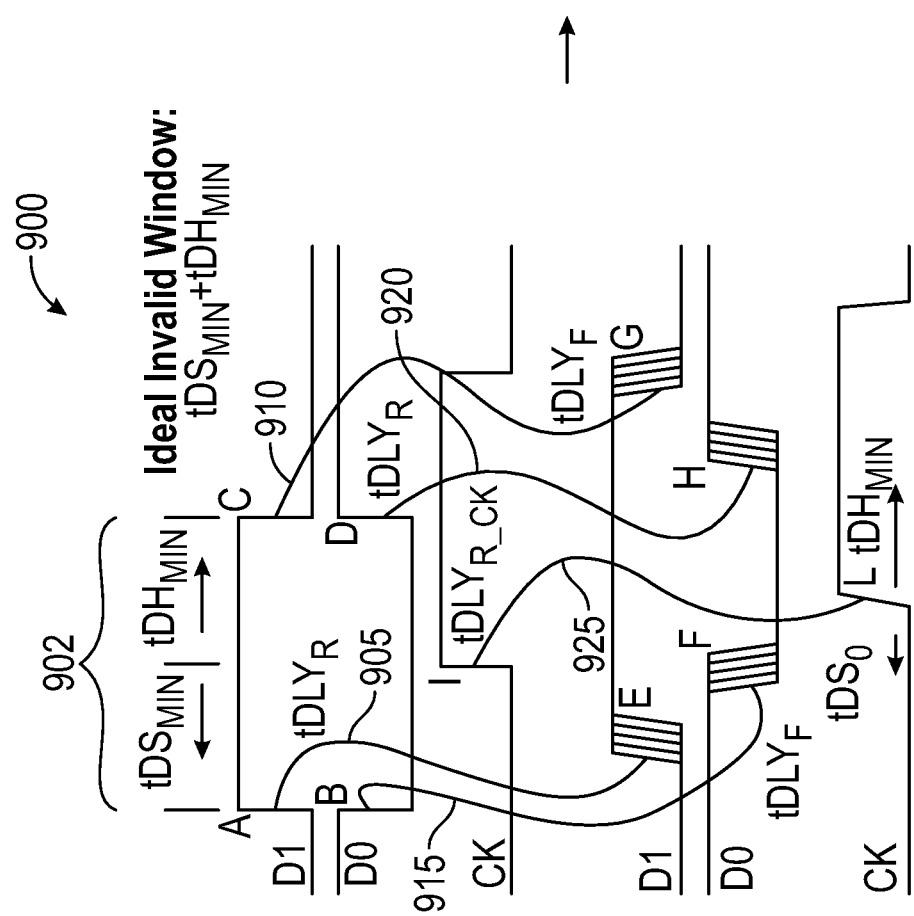
FIG. 8
FIG. 9

SYSTEMS AND METHODS INVOLVING WRITE TRAINING TO IMPROVE DATA VALID WINDOWS

RELATED APPLICATIONS

The present application is a continuation application of U.S. patent application Ser. No. 17/092,046, filed Nov. 6, 2020 which is a continuation application of U.S. patent application Ser. No. 16/447,727, filed Jun. 20, 2019, issued as U.S. Pat. No. 10,861,517 on Dec. 8, 2020 and entitled "SYSTEMS AND METHODS INVOLVING MEMORY-SIDE (NAND-SIDE) WRITE TRAINING TO IMPROVE DATA VALID WINDOWS", the entire disclosures of which applications are hereby incorporated herein by reference.

TECHNICAL FIELD

The present disclosure relates generally to improved semiconductor memory operation, and more particularly, to systems and methods involving improved memory-side write training to optimize the data valid window in memory arrays.

BACKGROUND

The increase in speed and associated requirements for semiconductor memory such as NAND have led to the introduction of various solutions to improve the data valid window for both read and write operations. One of the most important features for write operation in DDR3 and DDR4 is the write training. FIG. 1 is a high-level block diagram 100 depicting elements of an illustrative memory system involved with write training, as known in the art. FIG. 1 shows a memory system 130 including a memory array 110, control side circuitry 140 associated with the memory system 130, and a controller 120 coupled to the memory array 110 to provide control signals such as write training. Write training is used in multi-die packaging to optimize the data valid window. It can be performed both on memory control (controller) side and on the memory side, and is basically used to adjust data and clock delay to optimize write performance. On the control (controller) side, write training operates to adjust data and clock delay, overall, to find a configuration that will be good for all of the die inside the package. FIG. 2 is a block diagram 200 depicting aspects of controller-side write training functionality in NAND memory, as known in the art. FIG. 2 shows, in regard to exemplary data signals DQi, DQj and DQS, an ideal controller output 210, a skewed controller output 220, the uncalibrated NAND inputs 230 e.g. subject to channel effect, as well as the adjusted NAND inputs after calibration 240. As shown in FIG. 2, the write training may perform calibration needed to guarantee correct setup and hold, such as by moving the data (DQ) and/or data strobe (DQS) edges into more proper alignment, as shown in 240.

On the memory side, write training acts like a trim by die, performed to adjust data and clock delay for each die inside the package. FIG. 3 is a block diagram 300 illustrating a known NAND side write training circuitry arrangement, which may be performed to delay DQ or DQS/DQSN to improve the data valid window (DVW) for the output, per die, per DQ. The arrangement of FIG. 3 comprises a first series of components 310 for each data signal and coupled to the D input of a multiplexer MUX 330, and a second series of components 320 for the clock signal having an output coupled to the clock input of the MUX 330. The series of components 310,320 may include an op amp 312,322 a duty trim cell 314,324 used to adjust data duty cycle, inverters 316A-B, 326A-B, and a delay trim cell 318,328. Timing diagrams of exemplary signals generated via these two branches, i.e. on Node A 340 and Node B 342, are illustrated and described in more detail beginning with FIG. 4A, below. The approach illustrated in FIG. 3 is designed to move the rising and falling edges of DQS/DQSN and DQ to optimize the valid data window, e.g., in an attempt to make setup and hold equal. A write training control signal 319,329 is provided as input to the delay trim cells 318,328, which are used to adjust data "0" and "1" setup and hold versus the clock. In operation, the rising and falling edges are moved, together, a same extent/quantity.

During write training, only adjustment of delay via the delay trim cell 318,328 is performed, as the duty trim is uncoupled to any write training control. Instead, the duty trim cell is generally used to correct data distortion, due to single-ended input buffer intrinsic distortion or PVT (process voltage temperature) variability. However, such an approach has drawbacks. First, duty trim is not accessible by write training. Secondly, the delay trim cells work contemporaneously on rising and falling edges, which itself can be a source of distortion that must be recovered or corrected, again. Finally, even if duty trim cell was available for write training, as duty trim cell modify rising and falling edges delay, a risk exists that such an arrangement would enter into an infinite loop. For this reason, only the delay cell is used for write training.

FIG. 4A depicts exemplary timing diagrams associated with the conventional circuit arrangement of FIG. 3, as known in the art. FIG. 4A illustrates an ideal input DQ/DQS timing diagram, at top, as well as an actual timing diagram of exemplary signals present on internal nodes A and B 340,342 of FIG. 3, at bottom. Referring to the top diagram, FIG. 4A illustrates ideal data inputs (DQ) at 402, e.g., d"0" 404 and d"1" 406, as well as an associated data strobe input (DQS) at 408. Given the ideal inputs shown, where d"0" and d"1" are perfectly aligned, the setup delays as to when d"0" and d"1" switch states should be equal, i.e., tDLY0 412 should be equal to tDLY1 410, under an ideal operating environment. However, as seen at 414 in the bottom diagram of FIG. 4A, the actual data signals detected on Node A are not ideal, e.g., due to internal distortion. Accordingly, the timing delays (tDLY0 and tDLY1) and distributions of actual signal d"0" 416 and of actual signal d"1" 418 are not equal, as shown in FIG. 4A. In practice, the delay of d"0", tDLY0 412, may be greater than the delay of d"1", tDLY0 410, or vice versa. Further, the times at which these signals transition (from low to high, or from high to low) may also occur at various different points of time, i.e., have differing offsets from the rising edge of an associated clock signal 420, as also shown. Here, for example, a comparison of tDS1 422 and tDH1 428 with tDS0 424 and tDH0 426 in FIG. 4A shows differing offset from the clock rising edge 429.

The disclosed technology remedies these and/or other deficiencies of existing memory-side write training in semiconductor memory devices.

BRIEF DESCRIPTION OF THE DRAWINGS

The foregoing and other objects, features, and advantages of the disclosure will be apparent from the following description of embodiments as illustrated in the accompanying drawings, in which reference characters refer to the same parts throughout the various views. The drawings are not necessarily to scale, emphasis instead being placed upon illustrating principles of the disclosure.

FIG. 4A depicts exemplary timing diagrams associated with the conventional circuit arrangement of FIG. 3, as known in the art.

FIG. 4C depict an exemplary timing diagram associated with ideal circuit operation known in the art.

FIG. 4D depicts an exemplary timing diagram associated with optimized circuit operation, according to embodiments of the disclosed technology.

FIGS. 4E and 4F depict exemplary timing diagrams associated with controlling edges of data signals, according to embodiments of the disclosed technology.

FIGS. 8 and 9 depict exemplary timing diagrams associated with controlling edges of data signals, according to embodiments of the disclosed technology.

DETAILED DESCRIPTION

The following disclosure describes various embodiments of systems and methods involving memory-side write training, such as implementations that improve the data valid window for memory arrays. According to the disclosed technology, one exemplary method for performing memory-side write training may comprise delaying a rising edge or a falling edge of a first data signal to adjust its not valid window, delaying a rising edge or a falling edge of a second data signal to adjust its not valid window, and aligning the two not valid windows to reduce the time that the data signals are not valid (e.g., unavailable for write), to thereby improve the data valid window (DVW) for memory operation. Further, such memory-side write training may be provided via 'memory-side' write training instructions or control, i.e., generated via circuitry integrated with the memory array such as circuitry that is integrally fabricated or packaged with the memory array, as opposed to write training control that is generated via an external or disparate controller component. In some implementations, the rising edge and the falling edge of both data signals and clock signals may be adjusted/delayed via dedicated trim cells (circuitry) present in the data paths located on the memory side of a memory system. As a result of the systems and methods herein, improved data valid window (DVW) for multi-die packages of semiconductor memories, including NAND memory arrays, may be achieved.

Figure 1:
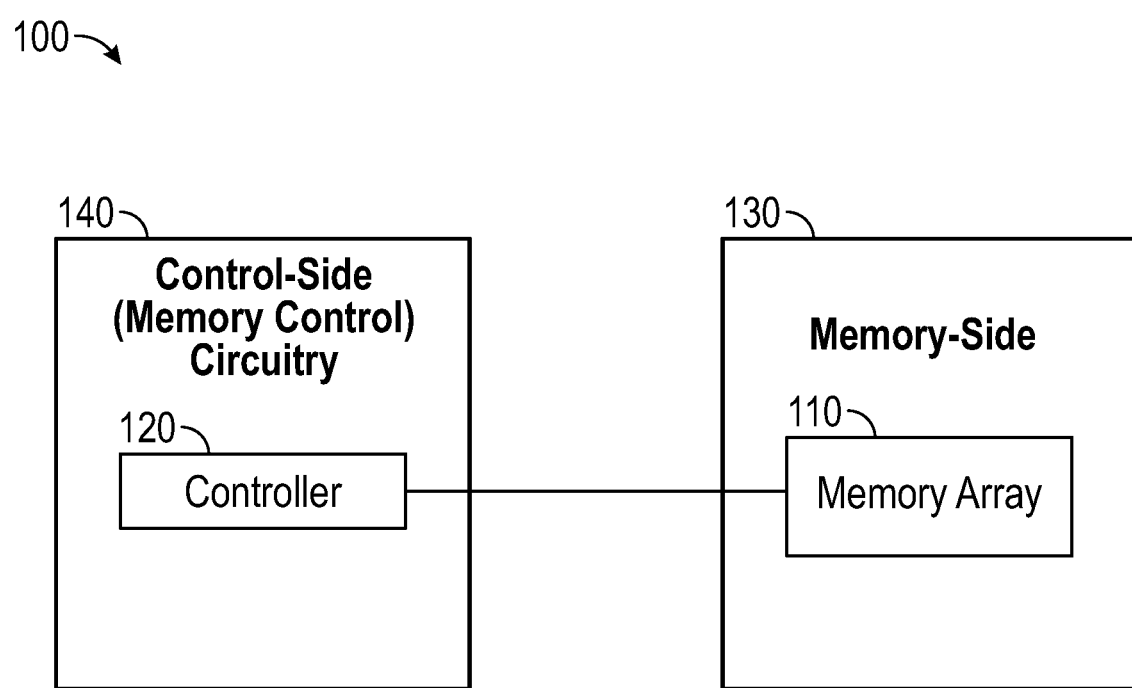
FIG. 1 is a high-level diagram depicting a representative memory system that performs write training, as known in the art.
Figure 2:
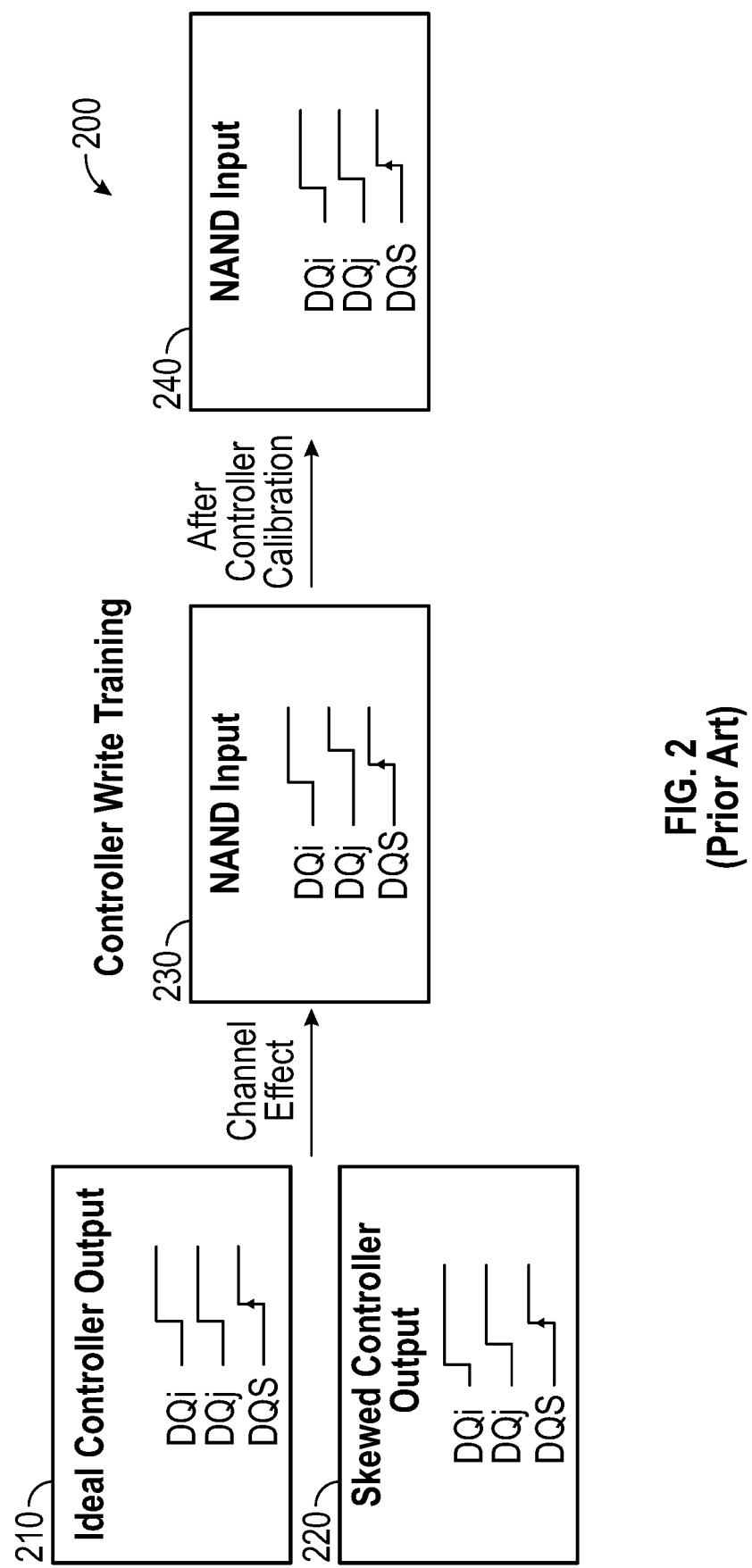
FIG. 2 is a diagram depicting aspects of controller-side write training functionality known in the art.
Figure 3:
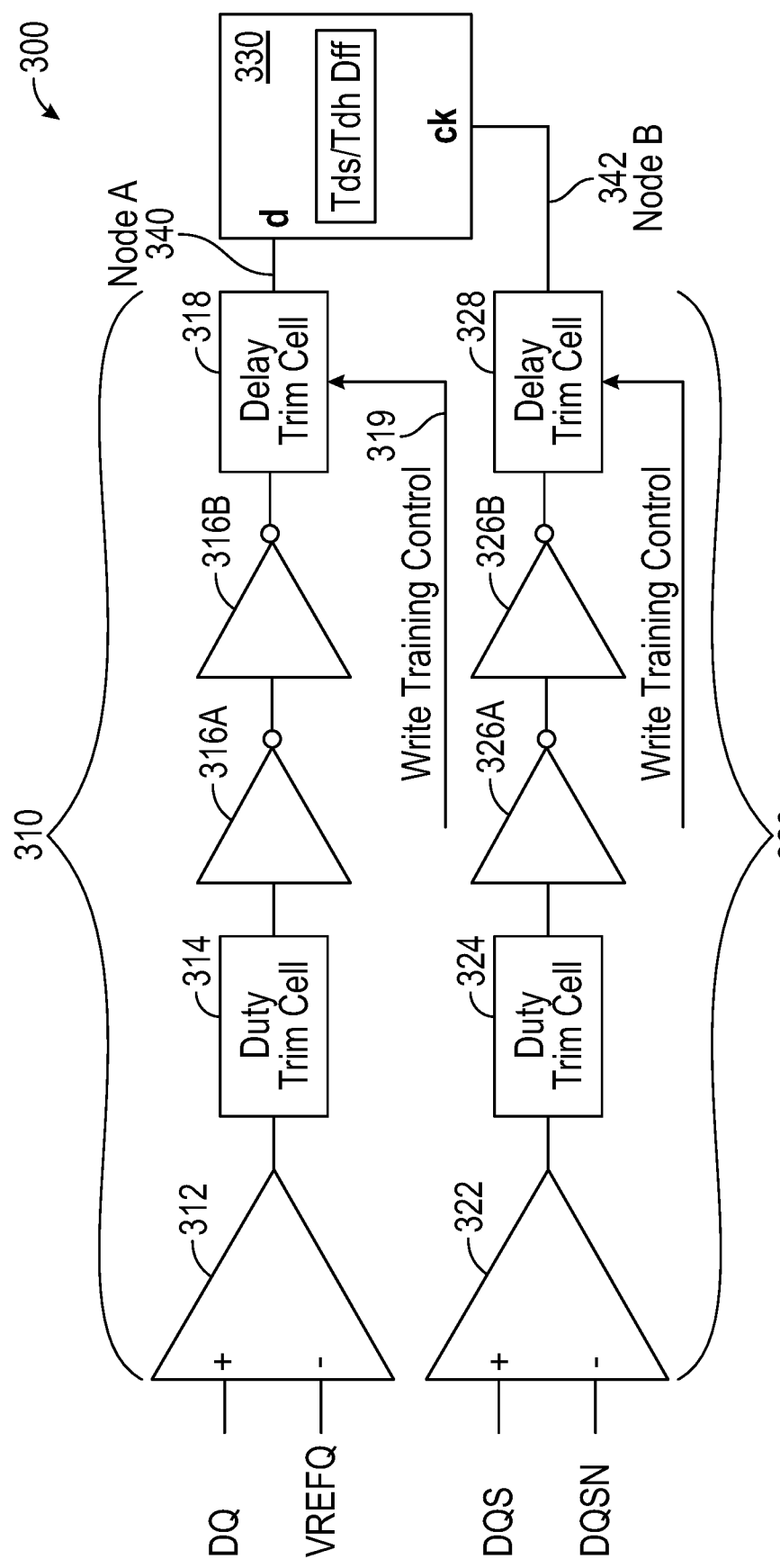
FIG. 3 is a block diagram depicting a known circuit arrangement that may employ memory-side write training known in the art.
Figure 4B:
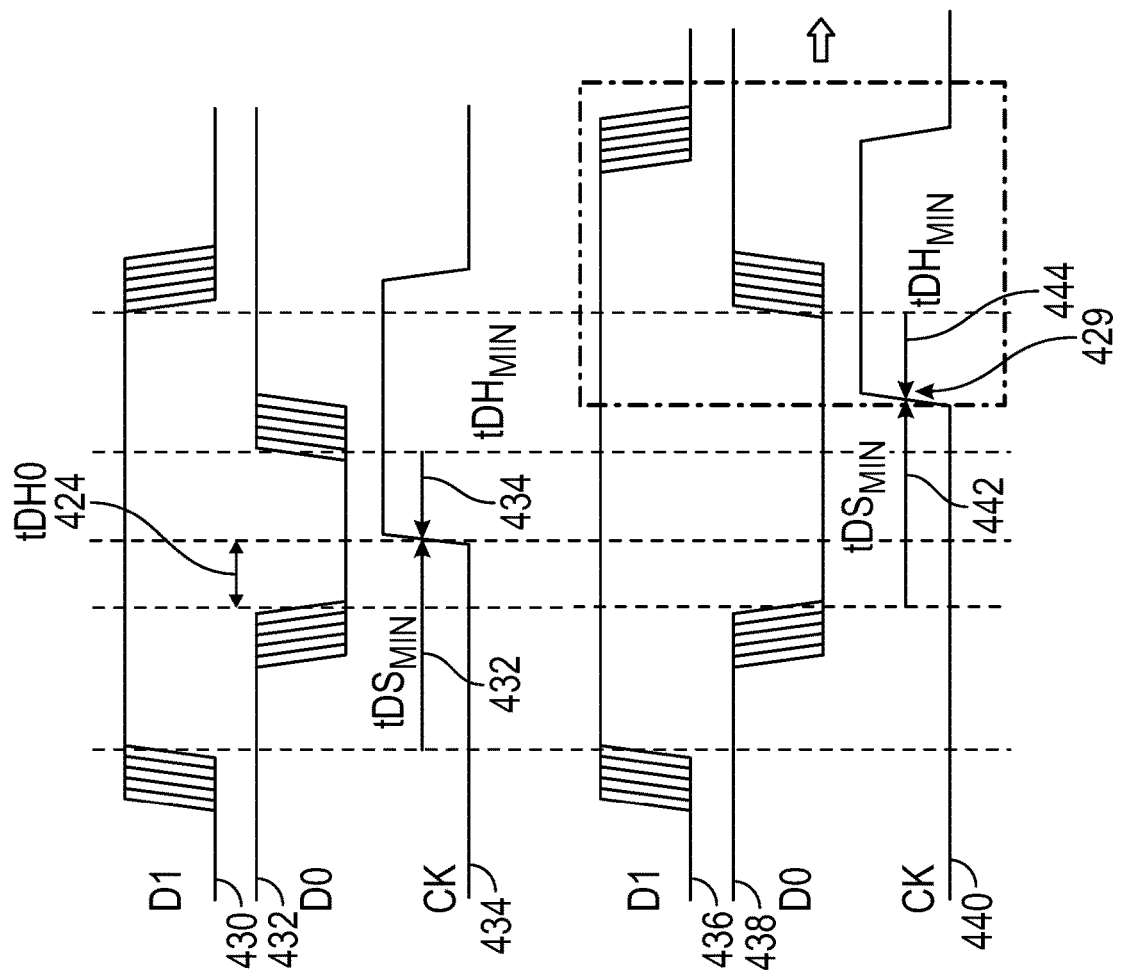
FIG. 4B depicts an exemplary timing diagram associated with optimizing circuit operation, according to embodiments of the disclosed technology.

FIG. 4C depict an exemplary timing diagram associated with circuit operation known in the art. FIGS. 4B and 4D depict exemplary timing diagrams associated with optimizing circuit operation, according to embodiments of the disclosed technology. FIG. 4C depicts an idealized ideal case of d"1" 450, d"0" 452 and clock 453 signals, where the setup delays tDLY1 and tDLY0 are equal and tDS0 is equal to tDS1, and illustrates a $tDS_{MIN}$ 456, a $tDH_{MIN}$ 458, as well as an ideal not valid window 454, which delineate when correctly latched data inside a latch, such as a D flip-flop (DFF), is guaranteed. In comparison with FIG. 4C, FIG. 4D depicts similar signals and illustrates a real or actual data not valid window 464 (or data invalid window), with tDHMIN 462 and 2*tDSMIN−tDH0 460 as adjusted per the timing corrections described in connection with FIG. 4B. FIG. 4B depicts a sequence of two timing diagrams, a top diagram and a bottom diagram each having d"1" 430,436, d"0" 432,438 and clock 434,440 signals, which illustrate actual (non-idealized) timing corrections made when tDLY0 is greater than tDLY1. As shown in FIG. 4B, because tDS0 424 is less than $tDS_{MIN}$ 432 (here, $tDS_{MIN}$ being equal to tDS1), the d"0" setup violation needs to be corrected by moving the leading edge of the d"0" transition ahead in time from the clock rising edge by a distance of $tDS_{MIN}$−tDS0. The waveforms resulting from this first correction are shown in the bottom diagram of FIG. 4B, which illustrates the leading (falling) edge of the d"0" having been moved ahead of the clock rising edge 429 a period of time 442 equal to $tDS_{MIN}$. Further, to maintain $tDH_{MIN}$ 434,444 of desired duration, the trailing edges of the d"0" distribution 436 and the d"1" distribution 438 need to be pushed ahead to $tDS_{MIN}$-tDS0 to guarantee that $tDS_{MIN}$ and $tDH_{MIN}$ are sufficient to achieve an optimized real invalid window, such as window 464 shown in FIG. 4D.

FIGS. 4E and 4F depict exemplary timing diagrams associated with separately controlling the d"0" and d"1" distribution delays, according to various embodiments of the disclosed technology set forth herein. Referring to FIG. 4E, a timing diagram is shown illustrating a d"1" data distribution 470, a d"0" data distribution 472, and an associated clock signal 474. By separately adjusting one or both of the leading and/or trailing edges of the d"1" distribution and/or the d"0" distribution, as described further below, their time periods may be aligned such that they overlap. In addition, the clock signal 474 may be adjusted to achieve $tDS_{MIN}$ 476 and $tDH_{MIN}$ 478 of desired dimension. Such alignment and overlap may generally be achieved, e.g., from non-aligned states of circuit operation such as those detailed above, in at least 2 ways. First, the d"0" may be pulled back. Second, the d"1" distribution and the clock rising edge may be pushed ahead. With the d"0" and d"1" distributions aligned and overlapping, and the clock rising edge pushed ahead, an adjusted data invalid window with optimized $tDS_{MIN}$ 460 and $tDH_{MIN}$ 462, such as that of FIG. 4F, may be achieved.

Figure 5A:
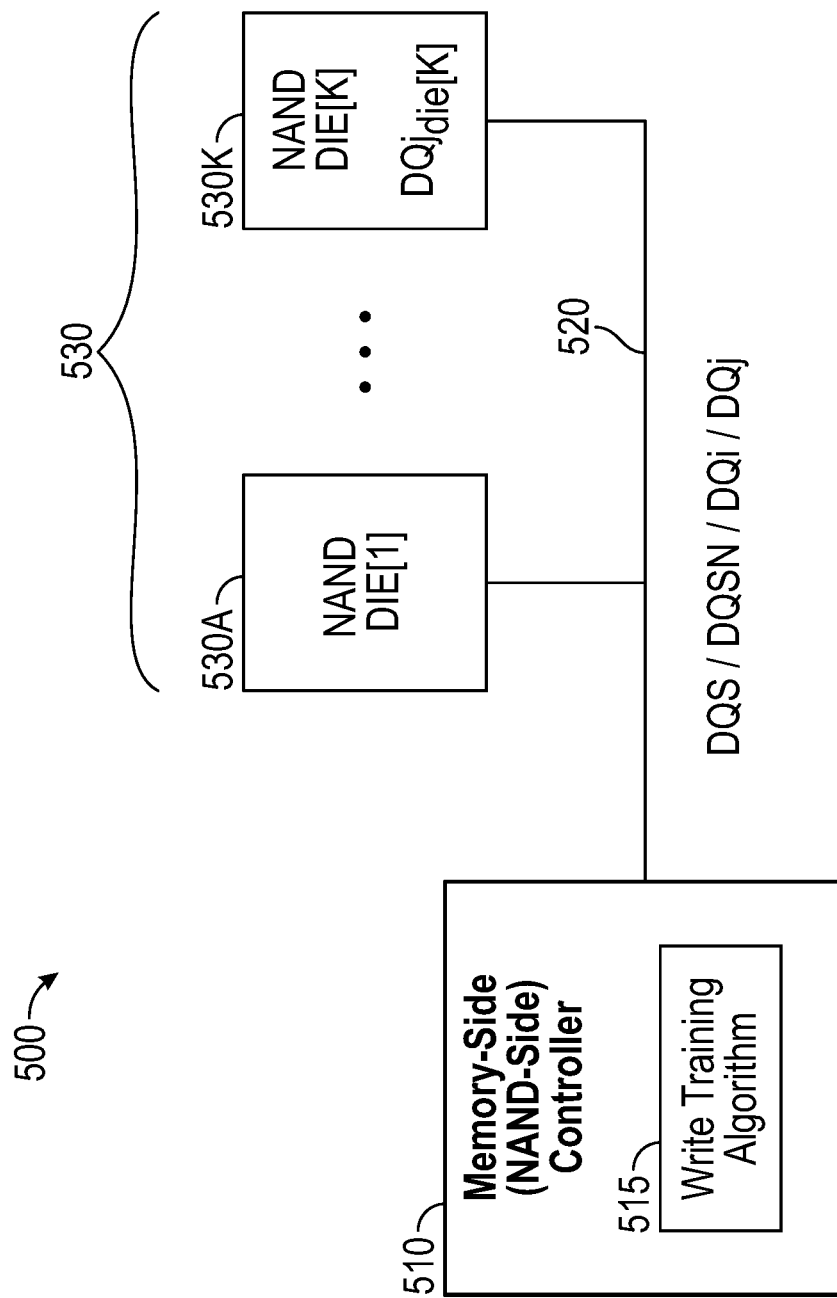
FIG. 5A is a block diagram depicting an illustrative memory system including memory-side write training aspects according to embodiments of the disclosed technology.

FIG. 5A is a block diagram depicting an exemplary memory system including memory-side write training aspects according to embodiments of the disclosed technology. FIG. 5A depicts an illustrative NAND memory array 530 comprised of NAND dies 530A . . . 530k, a memory-side controller 510 having a write training algorithm 515, and a control signal 520 provided from the controller 510 to the NAND memory array 530. Referring to FIG. 5A, the write training algorithm, which may be implemented via firmware in some implementations, is used to generate the write training control signals that adjust delay in the rising edges and falling edges of the data signals (e.g., for data 1, data 0, etc.) via the trim cells or circuitry set forth in more detail in connection with FIG. 6, below.

Figure 5B:
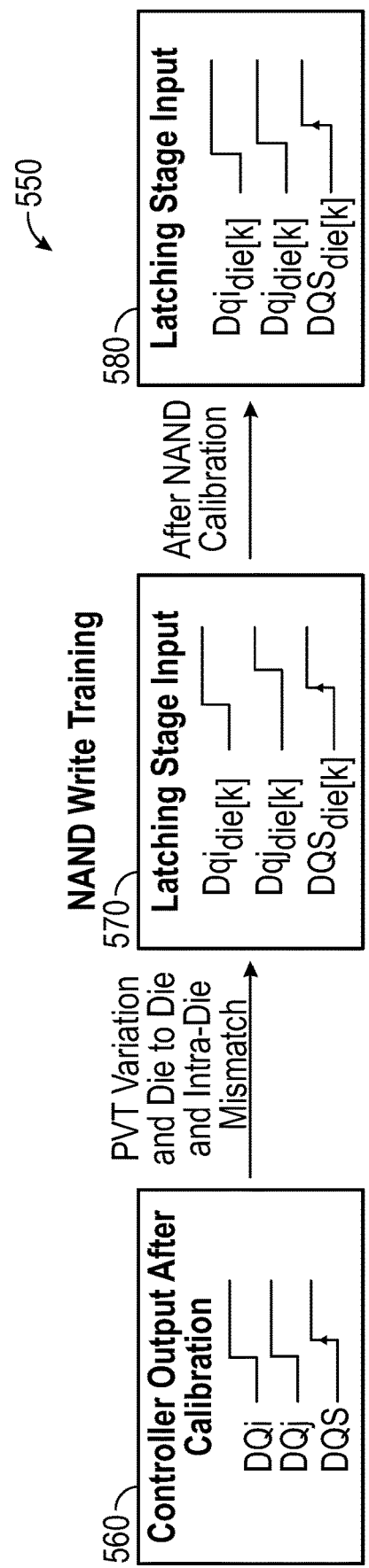
FIG. 5B is a diagram depicting aspects of memory-side write training functionality according to embodiments of the disclosed technology.

FIG. 5B is a block diagram 550 depicting aspects of memory-side write training functionality according to embodiments of the disclosed technology. FIG. 5B shows, with respect to exemplary data signals DQi, DQj and DQS, representative signals at the controller output after calibration 560, raw latching stage input signals 570 e.g. subject to memory operation fluctuations such as PVT (process voltage temperature) variation, die-to-die/intra-die mismatch, etc., as well as the adjusted latching stage input 580 e.g. after the memory-side calibration. As shown in FIG. 5B, the write training may perform calibration needed to guarantee correct setup and hold, such as by moving DQ and DQS edges inside a single die.

Figure 6:
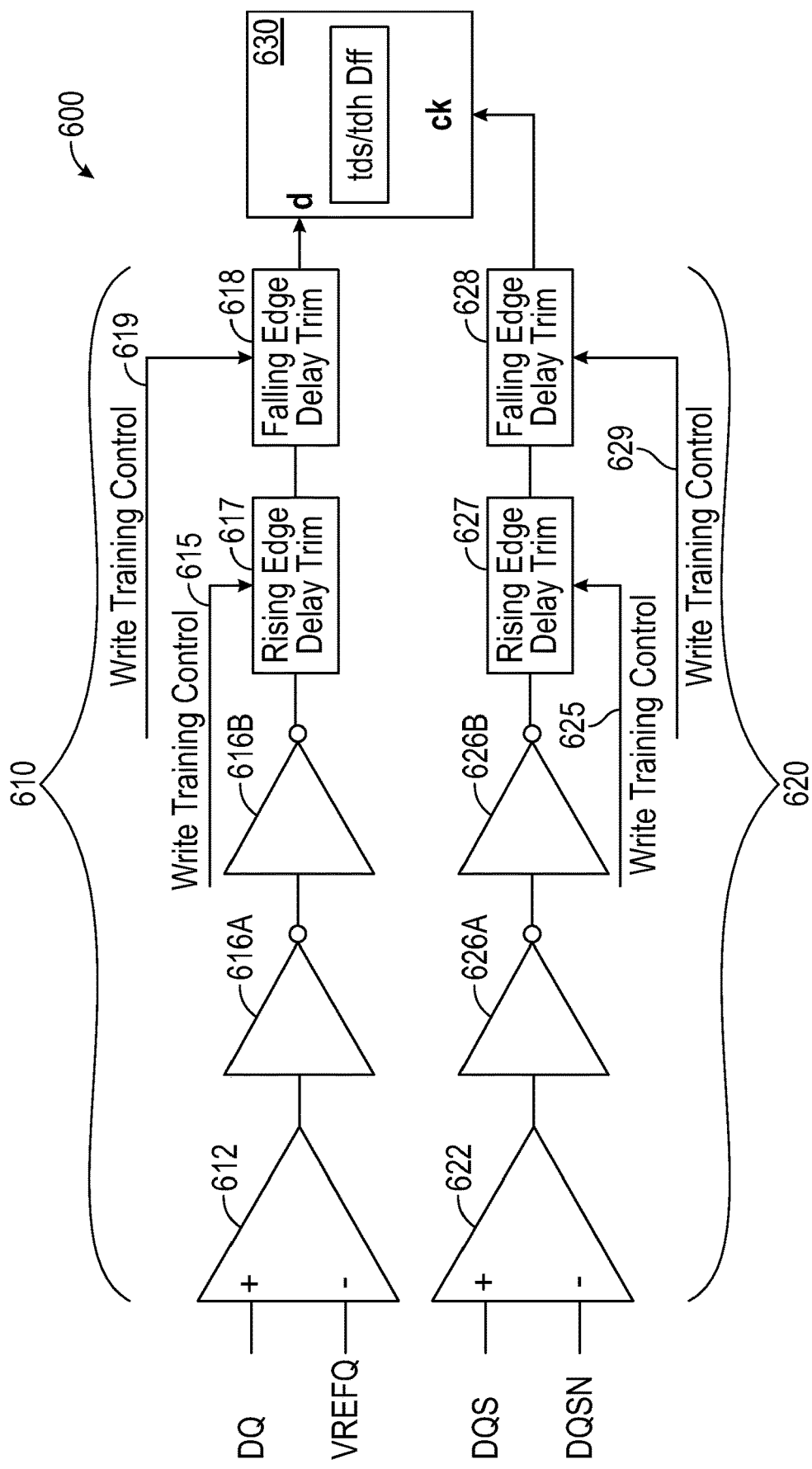
FIG. 6 is a block diagram of an illustrative circuit arrangement according to embodiments of the disclosed technology.

FIG. 6 is a block diagram of an illustrative circuit arrangement according to embodiments of the disclosed technology. The arrangement of FIG. 6 comprises one or more first series of components 610 each for a data signal and coupled to the D input(s) of a multiplexer MUX 630, and a second series of components 620 for the clock signal having an output coupled to the clock input of the MUX 630. Each series of components 610,620 may include an op amp 612,622, inverters 616A-B,626A-B, rising edge trim cells 617,627, and falling edge trim cells 618,628.

With regard to each first series of components 610, the rising edge trim cell 617 is configured to delay or adjust a rising edge of its data signal based on a rising edge write training control 615, and the falling edge trim cell 618 is configured to delay or adjust a falling edge of the data signal based on a falling edge write training control 619. The op amp 612 may be coupled to a data signal (DQ) as a first input and a reference voltage (Vrefq) as a second input. With regard to the second series of components 620, the rising edge trim cell 627 is configured to delay or adjust a rising edge of the clock signal based on a rising edge write training control 625, and the falling edge trim cell 628 is configured to delay or adjust a falling edge of the clock signal based on a falling edge write training control 629. As compared to prior solutions, these circuit arrangements omit a duty trim cell, while splitting operation of a single delay trim cell into a rising edge delay trim cell 617,627 and a falling edge delay trim cell 618,628. As a result of such separate control of both the rising and falling edges, the delays of the data signals and the clock signal may be adjusted separately to align the windows of all desired signals in an overlapping manner, such as shown and described in more detail in connection with FIG. 7.

Figure 7:
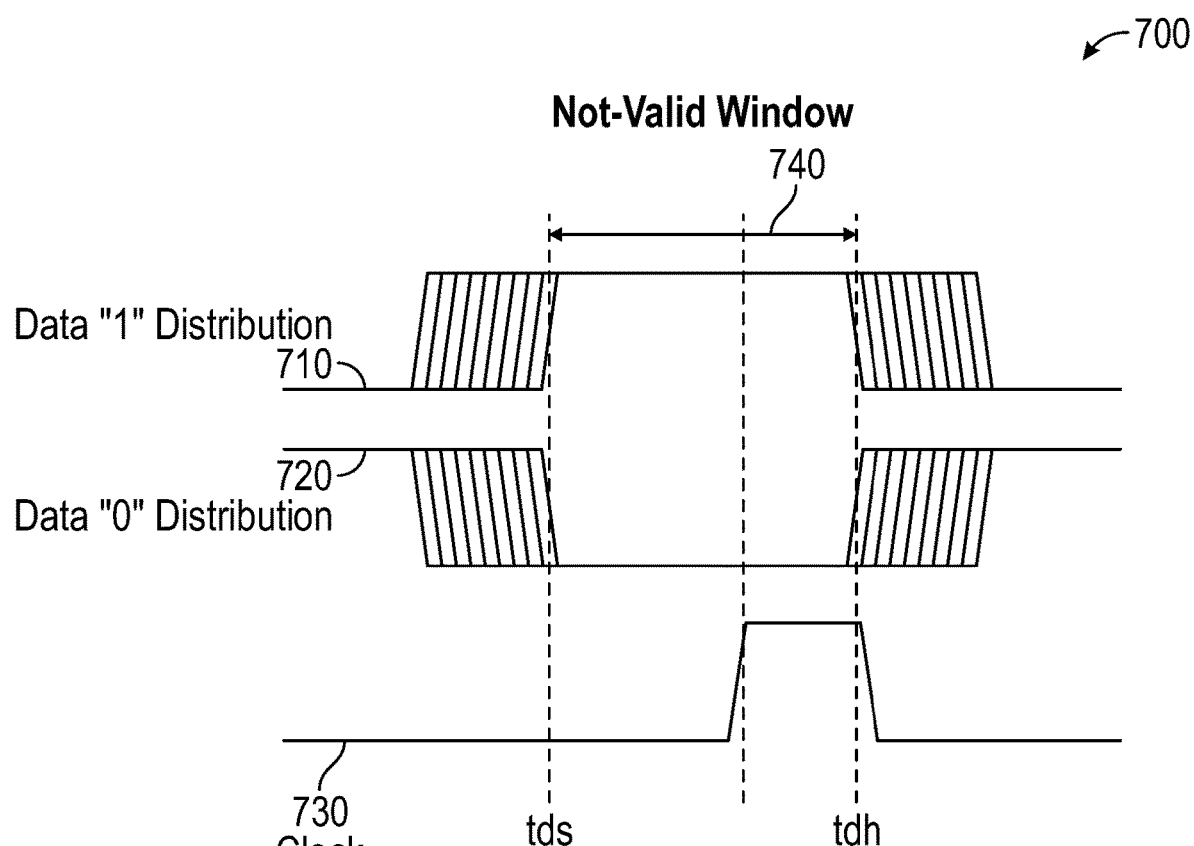
FIG. 7 is a graphical illustration of an exemplary data valid window (DVW) associated with exemplary circuit arrangements such as FIG. 6, according to embodiments of the disclosed technology.

FIG. 7 is a graphical illustration 700 of an exemplary data valid window (DVW) associated with the presently disclosed technology, such as that of FIG. 6, according to embodiments of the disclosed technology. FIG. 7 illustrates an exemplary distribution of data "1" 710, an exemplary distribution of data "0" 720, as well as associated timing of the relevant clock signal 730 after adjustment. Referring to FIG. 7, the duration or period of time 740 that the DVW is not valid may be minimized, as shown, by delaying/adjusting both the rising and falling edges of the data "1" signal, separately, in parallel with similar though separate adjustment of both the rising and falling edges of the data "0" signal, and in conjunction with similar and separate control of the rising and falling edges of the clock signal. With regard to such separate control, a write training algorithm 515 may be utilized to provide distinct control of the delays to separately adjust both data "0" and data "1" setup and hold, as well as to similarly adjust the clock signal. As a function of such separate and differing control of separate edges on both data lines, distributions of data "1" and data "0" may be overlapped and alignment of same with the clock may be achieved, as shown in FIG. 7. Accordingly, duty cycle distortion in the data (DQ) path may be eliminated and the data valid window may be improved.

FIGS. 8-9 depict exemplary timing diagrams associated with controlling edges of data signals, according to embodiments of the disclosed technology. In contrast to known systems where rising and falling edges move together, FIGS. 8-11 and other innovations herein describe innovations wherein edges, such as rising and falling edges, are moved separately. FIG. 8 illustrates a timing diagram 900 two sets of d"1", d"0" and clock signals: a set of ideal signals, at top, including an ideal data not valid window 902, as well as another set of signals, at bottom, showing actual operation including effects of real-world delay. Correspondence between the edges of the ideal signals and the edges of the actual signals is shown, at 905, 910, 915, 920 and 925. As seen in the bottom set of signals, because of delay, d"0" is violating setup, i.e., the falling edge of d"0" (edge F) is too close to the clock signal (edge L), such that it is less than $tDS_{MIN}$. To achieve or guarantee $tDS_{MIN}$, the falling edge of d"0" should be pulled back, i.e., adjust or reduce $tDLY_F$ via a trim cell. In this regard, the present innovations enable such adjustment via pulling back only the falling (leading) edge of d"0". Here, $tDLY_F$ must be reduced by $tDS_{MIN}$-$tDS_0$, where $tDS_0$ is the distance or difference between edge F and edge L. By such adjustment, edge F is pulled back into alignment with edge E of the d"1" signal. Since only this falling (leading) edge is moved, the adjustment does not lead to a violation of $tDH_{MIN}$ (the distance between edges H and L), i.e., edge H remains fixed with no change on this rising (trailing) edge of the d"0" signal. With regard to a separate adjustment, the falling or trailing edge of the d"1" signal (edge G) may also be adjusted, i.e. pulled back, a period of time corresponding to $tDS_{MIN}$–$tDS_0$. As a result of such adjustment, edge G of the d"1" signal would then be aligned with edge H of the d"0" signal.

FIG. 9 is an exemplary timing diagram 950 illustrating the resulting positions of the edges of the d"1" signal and the d "0" signal after the adjustment(s) described in connection with FIG. 8 are performed. FIG. 9 depicts the same ideal not valid window 902, at top, as well as adjusted windows 965 of the d"1" and d"0" signals, at bottom. FIG. 9 illustrates how the falling (trailing) edge of the d"1" signal has been pulled back, at 955, into alignment with the rising (trailing) edge of the d"0" signal, as well as how the falling (leading) edge of the d"0" signal has been pulled back, at 960, into alignment with the rising (leading) edge of the d"1" signal.

Figure 11:
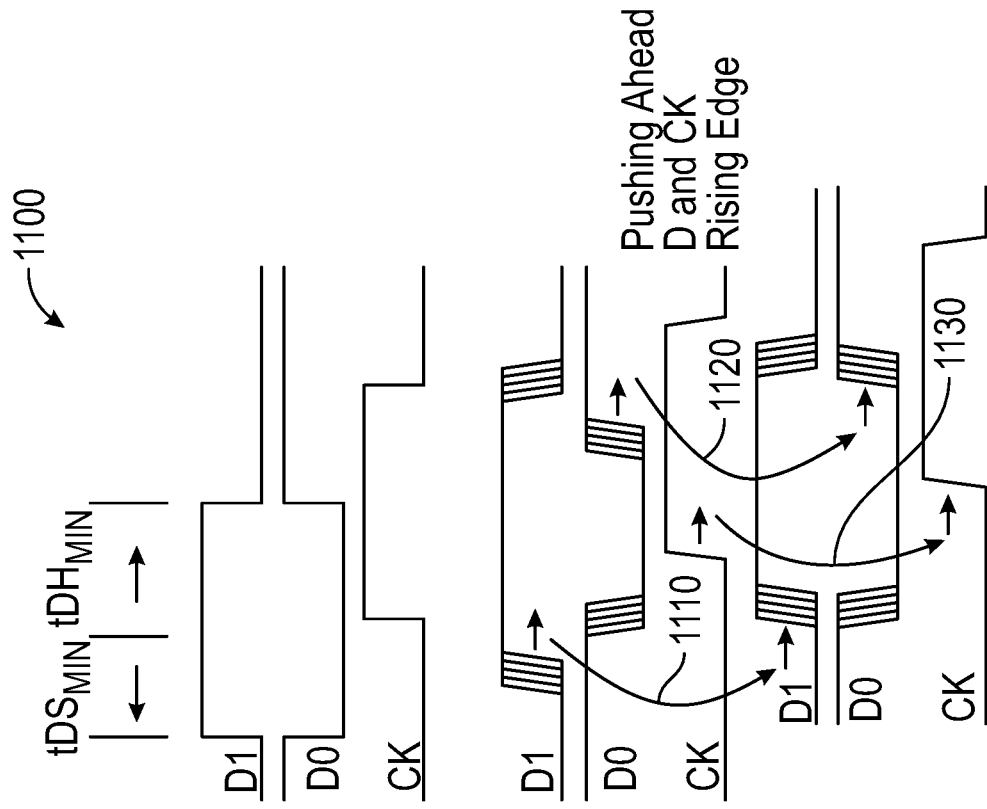
FIGS. 10 and 11 depict exemplary timing diagrams associated with controlling edges of data and/or clock signals, according to embodiments of the disclosed technology.
Figure 10:
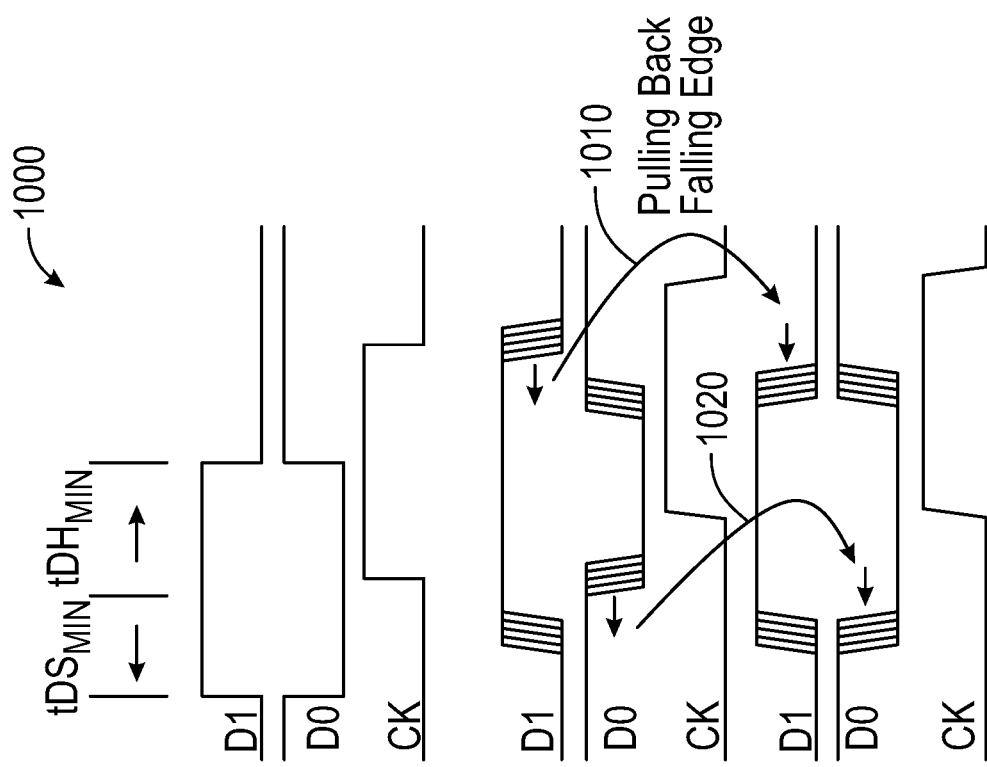

FIGS. 10 and 11 depict exemplary timing diagrams associated with two approaches of controlling edges of data and clock signals, according to embodiments of the disclosed technology. One or both of the approaches shown in FIGS. 10 and 11 may be utilized based on how the trim cells (e.g., 617, 618, 627, 628) are arranged, configured and/or operated. Referring to FIGS. 10 and 11, three sets of d"1", d"0" and clock signals are illustrated in each drawing: a first set of ideal signals, at top; a second set of real signals illustrating the effects of delay, at middle; and a third set of adjusted signals, at bottom, showing changes or adjustments of these signals as a result of the two approaches. FIG. 10 illustrates a first approach 1000 wherein a falling edge of a d"1" signal is pulled back, at 1010, and/or wherein a falling edge of a d"0" signal is pulled back, at 1020. As a result of such movement of one or both of the d"1" signal and/or the d"0" signal, the adjusted and aligned windows shown at the bottom of FIG. 10 may be achieved. FIG. 11 illustrates a second approach 1100 wherein a rising edge of a d"1" signal is moved forward, at 1110, when a rising edge of a d"0" signal is moved forward, at 1120, and/or when a rising edge of a clock signal is moved forward, at 1130. As a result of such movement of one or more of the d"1" signal, the d"0" signal and/or the clock signal, the adjusted and aligned windows shown at the bottom of FIG. 11 may be achieved.

As such, in connection with such separate control including discrete control of the rising edges and falling edges, improvements in the data valid window(s) for multi-die memory packages are achieved. The ability of the disclosed technology to provide improved data valid windows during write operation also provides improved production yields due to the wider variation of valid memory operation for any given memory, thus the present innovations also provide a consequent economic advantage over known technology. Moreover, systems and methods herein may be implemented without significant additional circuitry or delay, and thus are also able to maintain high-speed operation that satisfies current memory access needs as well as requirements presently established for future generations of memory products.

The subject matter disclosed above may be embodied in a variety of different forms and, therefore, covered or claimed subject matter is intended to be construed as not being limited to any specific or single example embodiment(s) set forth herein. In other words, the various example embodiments, such as set forth above, are provided merely to be illustrative. Likewise, a reasonably broad scope for claimed or covered subject matter is intended. Among other things, for example, subject matter may be embodied as methods, devices, components, or systems. Accordingly, embodiments may, for example, take the form of hardware, software, firmware or any combination thereof (other than software per se). The following detailed description is, therefore, not intended to be taken in a limiting sense.

Throughout the specification and claims, terms may have nuanced meanings suggested or implied in context beyond an explicitly stated meaning. Likewise, the phrase "in one embodiment" as used herein does not necessarily refer to the same embodiment and the phrase "in another embodiment" as used herein does not necessarily refer to a different embodiment. It is intended, for example, that claimed subject matter include combinations of example embodiments in whole or in part.

In general, terminology may be understood at least in part from usage in context. For example, terms, such as "and", "or", or "and/or," as used herein may include a variety of meanings that may depend at least in part upon the context in which such terms are used. Typically, "or" if used to associate a list, such as A, B or C, is intended to mean A, B, and C, here used in the inclusive sense, as well as A, B or C, here used in the exclusive sense. In addition, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

Those skilled in the art will recognize that the methods and devices of the present disclosure may be implemented in many manners and as such are not to be limited by the foregoing exemplary embodiments and examples. In other words, aspects/elements can be performed by single or multiple components, in various combinations and/or sub-combinations, and individual aspects, may be distributed among components and/or subcomponents. In this regard, any number of the features of the different embodiments described herein may be combined into single or multiple embodiments, and alternate embodiments having fewer than, or more than, all the features described herein are possible.

While various embodiments have been described for purposes of this disclosure, such embodiments should not be deemed to limit the teaching of this disclosure to those embodiments. Various changes and modifications may be made to the elements and features described above to obtain a result that remains within the scope of the systems and processes described in this disclosure.

The invention claimed is:

1. A device comprising:
control circuitry configured to be coupled to multiple memory cells, the control circuitry configured to adjust a first signal edge of a first signal, and adjust a second signal edge of a second signal, to increase a period of time data of the first signal and data of the second signal are valid for performing memory operation.

2. The device of claim 1, wherein the control circuitry is further configured to:
adjust the first signal edge to adjust a position of a first not-valid window associated with distribution of the first signal; and
adjust the second signal edge to adjust a position of a second not-valid window associated with distribution of the second signal.

3. The device of claim 1, wherein the control circuitry comprises:
first circuitry configured to adjust at least a rising edge or a falling edge of the first signal; and
second circuitry is configured to adjust at least a falling edge or a rising edge of the second signal.

4. The device of claim 1, wherein the control circuitry is further configured to adjust a rising edge or a falling edge of the first signal to adjust a position of a first not-valid window associated with the first signal, and adjust a falling edge or a rising edge of the second signal to adjust a position of a second not-valid window associated with the second signal.

5. The device of claim 4, wherein alignment of the first not valid window and the second not valid window reduces a period of time that the first signal and the second signal are not valid.

6. The device of claim 5, wherein a data valid window to perform memory operations is increased by an amount corresponding to the period of time.

7. The device of claim 1, wherein the control circuitry is further configured to adjust edges of the first signal, the second signal and a clock signal, without using delay introduced by duty trim cells.

8. The device of claim 1, wherein the control circuitry is further configured to align a rising edge of the first signal with a falling edge of the second signal by separately controlling delay of the rising edge of the first signal.

9. The device of claim 1, wherein the control circuitry is further configured to align a rising edge of a clock signal with one or both of the first signal and the second signal by separately controlling delay of the rising edge of the clock signal.

10. A device comprising:
a first circuit configured to adjust an edge of a data signal;
a second circuit configured to adjust an edge of a clock signal; and
control circuitry configured to control the first circuit and the second circuit to increase a period of time that the data signal is valid.

11. The device of claim 10, wherein the control circuitry is further configured to control the first circuit and the second circuit separately from one another.

12. The device of claim 11, wherein:
the first circuit and the second circuit are controlled such that a first not-valid window defined by edges of a data 1 signal, and a second not-valid window defined by edges of a data 0 signal overlap; and
the first not-valid window and the second not-valid window are separately adjustable via separate control of the first circuit and the second circuit.

13. The device of claim 10, wherein:
the first circuit comprises a first edge delay circuit configured to delay a rising edge of the data signal, and a second edge delay circuit configured to delay a falling edge of the data signal; and
the second circuit comprises a third edge delay circuit configured to delay a rising edge of the clock signal, and a fourth edge delay circuit configured to delay a falling edge of the clock signal.

14. The device of claim 10, wherein the control circuitry is further configured to move a falling edge of a data 1 signal, including one or both of pulling back a falling edge of the data 1 signal and pulling back a falling edge of a data 0 signal.

15. The device of claim 10, wherein the control circuitry is further configured to move a rising edge of a data 1 signal, including shifting forward one or both of a rising edge of the data 1 signal and a rising edge of a data 0 signal.

16. The device of claim 10, wherein:
the first circuit is configured to adjust a rising edge or a falling edge of the first signal to adjust a position of a first not-valid window; and
the second circuit is configured to adjust a rising edge or a falling edge of the second signal to adjust a position of a second not-valid window.

17. A system comprising:
edge delay circuitry comprising a first circuit path associated with a first signal, and a second circuit path associated with a second signal, wherein the first circuit path adjust an edge of a first signal, and the second circuit adjust an edge of a second signal; and
a controller configured to align a first window of the first signal with a second window of the second signal.

18. The system of claim 17, wherein a first not valid window is aligned with a second not valid window to reduce an overall period of time that first data and second data are not valid for performing memory operation.

19. The system of claim 17, wherein the edge delay circuitry is contained within a memory package and coupled to dies of memory cells to provide write training instructions.

20. The system of claim 19, wherein the edge delay circuitry is configured, in connection with the write training instructions, to align a leading edge of a distribution for data 1 with a leading edge of a distribution for data 0, and to align a trailing edge of the distribution for data 1 with a trailing edge of the distribution for data 0.

* * * * *